(12) United States Patent
Cooper et al.

(10) Patent No.: US 7,482,822 B2
(45) Date of Patent: Jan. 27, 2009

(54) APPARATUS AND METHOD FOR LIMITING OVER TRAVEL IN A PROBE CARD ASSEMBLY

(75) Inventors: Timothy E. Cooper, Discovery Bay, CA (US); Benjamin N. Eldridge, Danville, CA (US); Carl V. Reynolds, Pleasanton, CA (US); Ravindra Vaman Shenoy, Dublin, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 11/461,734

(22) Filed: Aug. 1, 2006

(65) Prior Publication Data
US 2006/0261827 A1    Nov. 23, 2006

Related U.S. Application Data

(62) Division of application No. 10/321,743, filed on Dec. 16, 2002, now Pat. No. 7,084,650.

(51) Int. Cl.
*G01R 31/02* (2006.01)

(52) U.S. Cl. .................. 324/754; 324/757; 324/761; 324/762

(58) Field of Classification Search .................. None
See application file for complete search history.

(56) References Cited

U.S. PATENT DOCUMENTS

| | | | |
|---|---|---|---|
| 4,615,573 A | 10/1986 | White et al. |
| 4,784,972 A | 11/1988 | Hatada |
| 4,916,002 A | 4/1990 | Carver |
| 4,965,865 A | 10/1990 | Trenary |
| 5,476,211 A | 12/1995 | Khandros |
| 5,546,375 A | 8/1996 | Shimada et al. |
| 5,555,422 A | 9/1996 | Nakano |
| 5,574,384 A | 11/1996 | Oi |
| 5,682,064 A | 10/1997 | Atkins et al. |
| 5,917,707 A | 6/1999 | Khandros et al. |
| 5,974,662 A | 11/1999 | Eldridge et al. |
| 6,028,437 A | 2/2000 | Potter |
| 6,268,015 B1 | 7/2001 | Mathieu |
| 6,292,005 B1 | 9/2001 | Suga |
| 6,336,269 B1 | 1/2002 | Eldridge et al. |
| 6,344,752 B1 | 2/2002 | Hagihara |
| 6,388,456 B1 | 5/2002 | Kojima |
| 6,469,537 B1 | 10/2002 | Akram et al. |
| 6,518,779 B1 | 2/2003 | Nakata et al. |
| 6,677,771 B2 | 1/2004 | Zhou et al. |
| 6,705,876 B2 | 3/2004 | Eldridge |
| 6,948,941 B2 | 9/2005 | Eldridge |

(Continued)

FOREIGN PATENT DOCUMENTS

CN    1317224    10/2001

(Continued)

*Primary Examiner*—Minh N Tang
(74) *Attorney, Agent, or Firm*—N. Kenneth Burraston (57) ABSTRACT

Methods and apparatuses for testing semiconductor devices are disclosed. Over travel stops limit over travel of a device to be tested with respect to probes of a probe card assembly. Feedback control techniques are employed to control relative movement of the device and the probe card assembly. A probe card assembly includes flexible base for absorbing excessive over travel of the device to be tested with respect to the probe card assembly.

6 Claims, 9 Drawing Sheets

U.S. PATENT DOCUMENTS

| | | |
|---|---|---|
| 7,073,254 B2 | 7/2006 | Eldridge et al. |
| 7,084,650 B2 | 8/2006 | Cooper |
| 7,086,149 B2 | 8/2006 | Eldridge et al. |
| 7,225,538 B2 | 6/2007 | Eldridge et al. |
| 2001/0012704 A1 | 8/2001 | Eldridge |
| 2002/0055282 A1 | 5/2002 | Eldridge et al. |
| 2002/0132501 A1 | 9/2002 | Eldridge et al. |
| 2002/0151194 A1 | 10/2002 | Grube |
| 2003/0199179 A1 | 10/2003 | Dozier et al. |
| 2005/0162179 A1* | 7/2005 | Hosaka et al. ............ 324/762 |
| 2006/0066334 A1 | 3/2006 | Martin et al. |

FOREIGN PATENT DOCUMENTS

| | | |
|---|---|---|
| JP | 59-088860 | 5/1984 |
| JP | 64-047090 | 2/1989 |
| JP | 0047090 | 2/1989 |
| JP | 06-140479 A | 5/1994 |
| TW | 460698 | 10/2001 |
| TW | 460703 | 10/2001 |
| WO | WO 97/43653 | 11/1997 |
| WO | WO 00/03569 | 1/2000 |

* cited by examiner

APPARATUS AND METHOD FOR LIMITING OVER TRAVEL IN A PROBE CARD ASSEMBLY

CROSS-REFERENCE TO RELATED APPLICATIONS

This application is a divisional of U.S. patent application Ser. No. 10/321,743, filed Dec. 16, 2002, (now U.S. Pat. No. 7,084,650).

FIELD OF THE INVENTION

The present invention relates to testing semiconductor devices.

BACKGROUND OF THE INVENTION

Individual semiconductor (integrated circuit) devices (dies) are typically produced by creating several identical devices on a semiconductor wafer using known techniques of photolithography, deposition, diffusion and the like. These processes are intended to create a plurality of fully functional integrated circuit devices, after which the individual dies are singulated (severed) from the semiconductor wafer. In practice, physical defects in the wafer itself and/or defects in the processing of the wafer often lead to some of the dies being "good" (fully functional) and some of the dies being "bad" (non-fully functional). It is generally desirable to be able to identify which of the plurality of dies on the wafer are good dies prior to their packaging (encapsulation within a transfer-molded plastic, ceramic or metal package for subsequent integration into a circuit), and preferably prior to their being singulated from the wafer. To this end, a wafer tester or "prober" is used to make a plurality of discrete pressure connections to a like plurality of discrete connection pins (or bond pads) on the dies. In this manner, the semiconductor dies can be tested and exercised prior to singulating the dies from the wafer. A conventional component of a wafer tester is a probe card assembly. In use, the wafer or device under test (DUT) and the probe card assembly are brought together so that the outboard tips of a plurality of probe elements are brought into electrical engagement with corresponding die pads on the wafer.

SUMMARY OF THE INVENTION

The present invention relates generally to testing semiconductor devices. In one aspect, the invention relates to over travel stops for limiting over travel of a device to be tested with respect to probes of a probe card assembly. Other aspects of the invention include feedback control of relative movement of the device and the probe card assembly and a probe card assembly with a flexible base for absorbing excessive over travel of the device with respect to the probe card assembly.

DESCRIPTION OF EXEMPLARY EMBODIMENTS

For the purposes of promoting an understanding of the principles of the invention, reference will now be made to the embodiments illustrated in the drawings and specific language will be used to describe the same. It will nevertheless be understood that no limitation of the scope of the invention is thereby intended, and any alterations or modifications in the illustrated device, and any further applications of the principles of the invention as illustrated therein are contemplated as would normally occur to one skilled in the art to which the invention relates.

Figure 1:
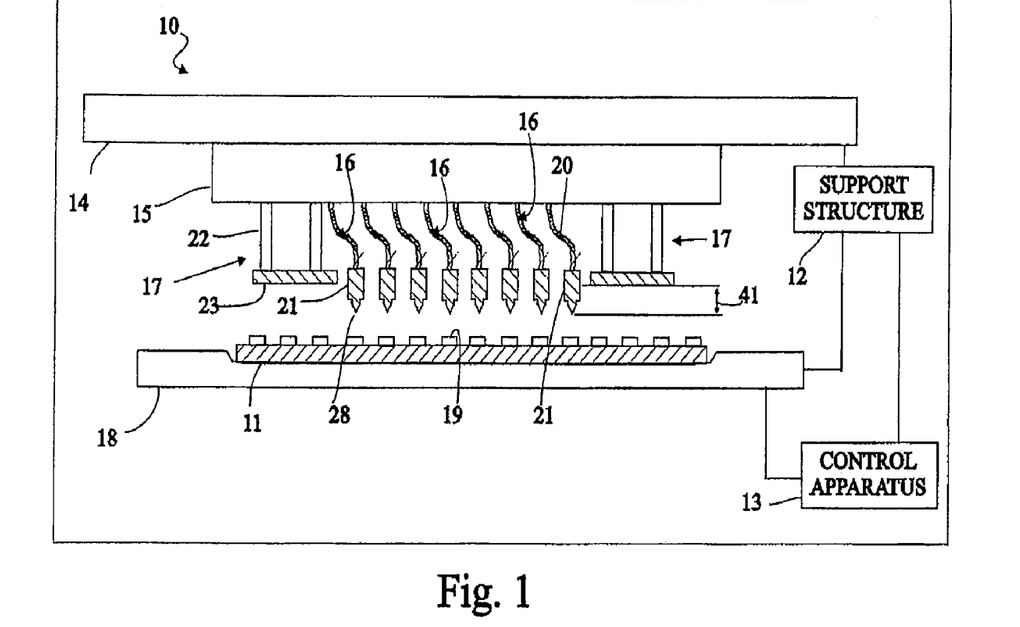
FIG. 1 is a side, partially cross-sectional, partially diagrammatic view of a semiconductor tester 5 with probe card assembly 10 positioned to engage with a semiconductor device 11 ("DUT") in accordance with an exemplary embodiment of the present invention.

Referring to FIG. 1, there is shown a semiconductor tester 5 for testing semiconductor devices. Tester 5 generally includes a probe card assembly 10, support structure 12, control apparatus 13 and a semiconductor device holder 18. Probe card assembly 10 is shown positioned to engage with and test a semiconductor device 11 (otherwise known as a device under test or "DUT") in accordance with the present invention.

The exemplary probe card assembly 10 illustrated in FIG. 1 generally includes a base assembly 14, a space transformer 15, a plurality of probes 16 (eight of many shown), and a plurality of overtravel stop assemblies 17. Support structure 12 supports probe card assembly 10 and can be operable to move probe card assembly 10 toward DUT 11 or to hold probe card assembly 10 stationary while DUT 11 is moved toward probe card assembly 10. Holder 18 is connected with support structure 12 and is configured to hold DUT 11 stationary during the testing procedure while probe card assembly 10 is moved toward DUT 11 or to move DUT 11 toward probe card assembly 10. Semiconductor device holder 18 can be in any configuration that securely holds semiconductor device 11 during testing. Holder 18 may also be configured to grasp a semiconductor device 11 from an indexing unit, move it into testing position, hold it and/or move it during testing, and then move it out of tester 5 to an output station. Holder 18 is contemplated in one embodiment to include electronic connection apparatus for electronically connecting or facilitating such connection of semiconductor device 11 with control apparatus 13. Control apparatus 13 is connected with support structure 12 and DUT holder 18 and includes elements such as computer hardware and software for controlling movement of probe card assembly 10 and/or DUT 11. In alternative embodiments, control apparatus 13 does not rely on computer components to control movement of probe card assembly 10 and/or DUT 11, but instead provides any type of manual actuation apparatus including, but not limited to levers, linkages, a rack and pinion mechanism, cables, pulleys and/or similar devices for moving probe card assembly 10 and/or DUT 11. Control apparatus 13 is also electronically connected with probe card assembly 10 and connectable to DUT 11 (either individually or through holder 18) to send and receive data testing signals thereto and therefrom.

Although probe card assembly 10 is illustrated in FIG. 1 as comprising a base 14 and a space transformer 15, probe card assembly may be any type of probe card assembly. For example, probe card assembly 10 may be as simple as only a base 14 to which probes 16 and over travel stops 17 are directly attached. As another example, probe card assembly 10 may comprise a more complex assembly of parts, such as the probe card assembly illustrated in U.S. Pat. No. 5,974,662, which is incorporated by reference herein in its entirety. Probes 16 may be any type of probes, including without limitation needle probes, buckling beam probes (e.g., "COBRA" probes), bumps, posts, and spring probes. Nonexclusive examples of spring probes include the spring contacts described in U.S. Patent Application Publication 2002/0055282 A1, U.S. patent application Ser. No. 09/032,473 (filed Feb. 26, 1998), U.S. patent application Ser. No. 10/262,712 (filed Jul. 24, 2002), U.S. Pat. Nos. 6,268,015, and 5,917,707, all of which are incorporated by reference in their entirety herein.

DUT 11 is a semiconductor wafer on which have been fabricated a plurality of integrated circuit chips or "dice" (not shown). Each individual die has a number of pins or bond pads 19 for providing power, ground, and signals such as data, address, control, etc. to the die. DUT 11 may contain many hundreds of bond pads 19 disposed in close proximity to one another (e.g. 5 mils center-to-center), and the bond pads may be arranged in configurations other than a single row near the edge of the die. Because of the close proximity of many bond pad arrays, the tips of probes 16 may often need to be spaced more closely to one another (relatively fine pitch) than the connections to their base assembly 14. "Space transforming" (sometimes referred to as "pitch spreading") may therefore be incorporated in the present application by a space transformer, representatively shown at 15 (comparable to element 506 in the U.S. Pat. No. 5,974,662 patent). Space transformer 15 facilitates making a reliable testing connection between the plurality of probes 16 and the corresponding bond pads 19 of DUT 11 by redirecting spatially indiscriminate input connections (not shown) from base assembly 14 to a specifically organized array of probes 16 that align with the mating array of bond pads 19 as shown, for example, in FIG. 1. The input connections (not shown) from base assembly 14 to space transformer 15 may be formed in any suitable manner.

Figure 2:
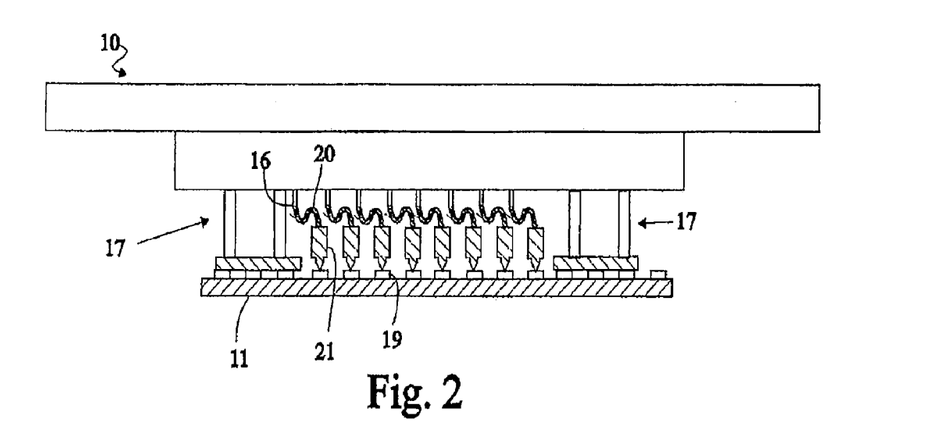
FIG. 2 is a side, partially cross-sectional view of the probe card assembly 10 of FIG. 1 shown in engagement with DUT 11.

Each of the exemplary plurality of probes 16 includes a resilient interconnecting wire element 20 and a probe tip 21. Each exemplary over travel stop assembly 17 includes a pair of substantially rigid posts 22 and a stop plates 23. Each post 22 is rigidly mounted in any suitable manner at one end to space transformer 15, and at its opposing end is mounted to a stop plate 23. As DUT 11 and probe card assembly 10 are brought together and probe tips 21 engage with corresponding bond pads 19, the resilient, spring-like wire elements 20 deform (as shown in FIG. 2). The neighboring over travel stop assemblies 17 engage DUT 11 at a predetermined distance (a proximity limit) to physically limit how close DUT 11 and probe card assembly 10 can get, and consequently to ensure the proper pressure engagement between probe tips 21 and bond pads 19.

Figure 3A:
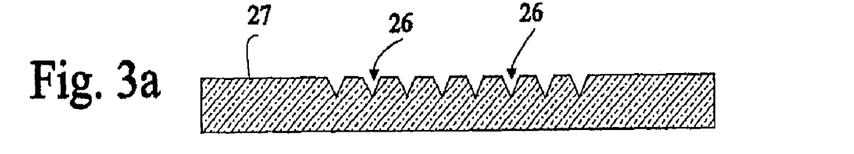
FIGS. 3a-3f are side, cross-sectional views showing, in stages, the fabrication of probe tips 21 and stop plates 23.
Figure 3B:
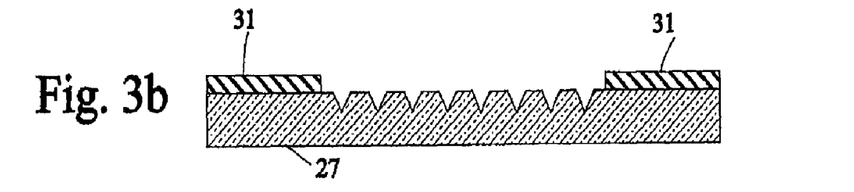

Referring to FIGS. 3a-3g and 4a-4c, there is shown an exemplary method for making a portion of probe card assembly 10 in accordance with one embodiment of the present invention. As shown in FIG. 3a, a plurality of pits 26 are etched in a sacrificial substrate 27, such as a semiconductor wafer, using known methods such as masking. The number and arrangement of pits 26 correspond to the number and arrangement of bond pads on the corresponding DUT to be tested. These pits 26 will form the ends 28 of probe tips 21. Referring to FIG. 3b, an optional first mask layer (mask 31) is formed, using known methods, over sacrificial substrate 27, proximal to pits 26, and in a specific size and shape. Mask 31 is preferably a photoresist material, such as SU8.

Figure 3C:
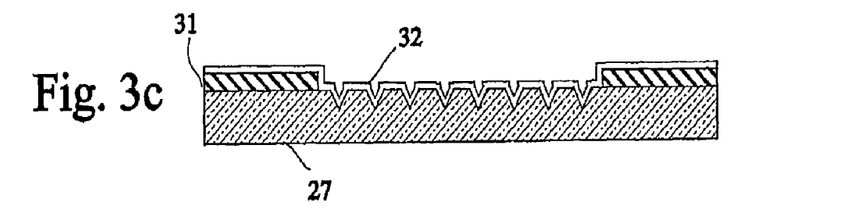

Referring to FIG. 3c, a release (and/or seed) material 32 is formed over the substrate and mask 31. Release material 32 is applied to facilitate separation between sacrificial substrate 27 and mask 31 thereunder and the probe tips 21 and stop plates 23 formed on top thereof. Also, if the probe tips 21 and stop plates 23 are formed by electroplating, release material 32 will provide the conductive layer necessary for electroplating. In one embodiment, release material 32 comprises aluminum. Other appropriate materials may be used for release material 32 including, but without limitation, copper, titanium, tungsten or alloys of these and/or other materials including materials made of two or more layers of such materials that function as described above. For purposes of illustration, the dimensions of certain elements shown in the figures may be exaggerated or not in proportion.

Figure 3D:
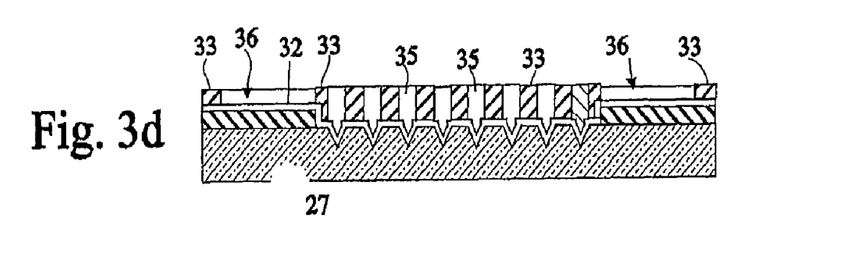
Figure 3E:
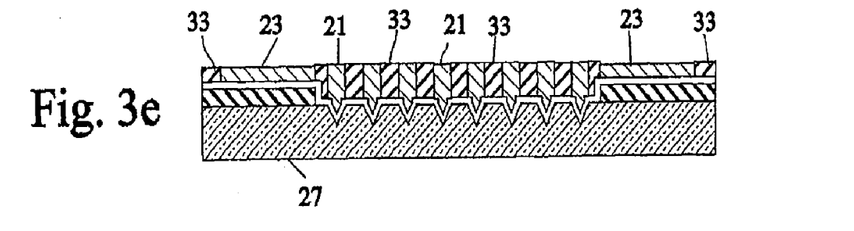
Figure 3F:
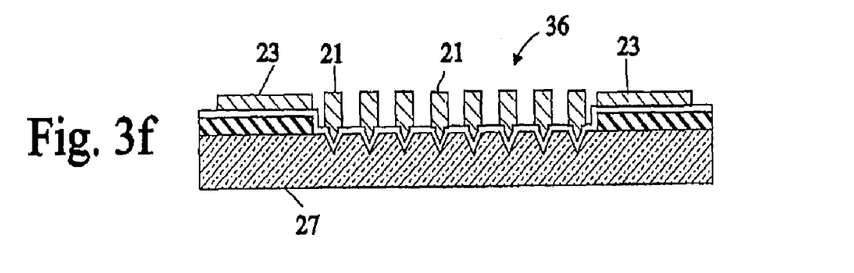

Referring to FIG. 3d, a second mask layer (mask 33) is formed in a specific pattern over sacrificial substrate 27, mask 31 and release material 32, as shown. Mask 33 defines a plurality of cavities 35 and 36 that are sized and shaped to create probe tips 21 and stop plates 23, respectively. A preferably conductive material is then deposited into cavities 35 and 36 to form probe tips 21 and stop plates 23, as shown in FIG. 3e. The material used to form tips 21 and plates 23 is generally desired to be conductive, non-oxidizing, and chemically non-reactive. Examples of appropriate materials include, without limitation, palladium, gold, rhodium, nickel, cobalt, silver, platinum, conductive nitrides, conductive carbides, tungsten, titanium, molybdenum, rhenium, indium, osmium, rhodium, copper, refractory metals, and their alloys as well as alloys of these and/or other materials. Any appropriate method may be used to deposit such material into cavities 35 and 36 such as, but without limitation, chemical vapor deposition, physical vapor deposition, sputtering, electroless plating, electron beam deposition, and thermal evaporation. Alternatively, a non-conductive material may be used for either or both of probe tips 21 and stop plates 23 such as aluminum oxide, aluminum nitride, etc. In the event a non-conductive material is used for probe tips 21, at least the ends 28 of tips 21 must be made conductive and must be electrically connected to wire elements 20. This may be done in any suitable manner such as, and without limitation, by coating the exterior surface of probe tips 21 with a conductive material. After formation of probe tips 21 and stop plates 23, mask 33 is removed to expose the probe tips 21 and stop plate 23, as shown in FIG. 3f. Because the tips 21 and stop plates 23 are formed lithographically, they may be formed with relatively precise spatial relationships to each other.

Figure 4A:
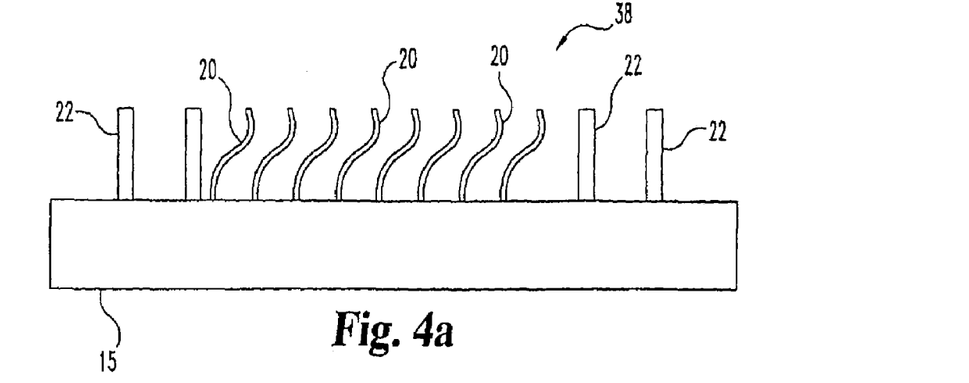
FIGS. 4a-4c are side, partially cross-sectional views showing, in stages, fabrication and assembly of space transformer assembly 40.
Figure 4B:
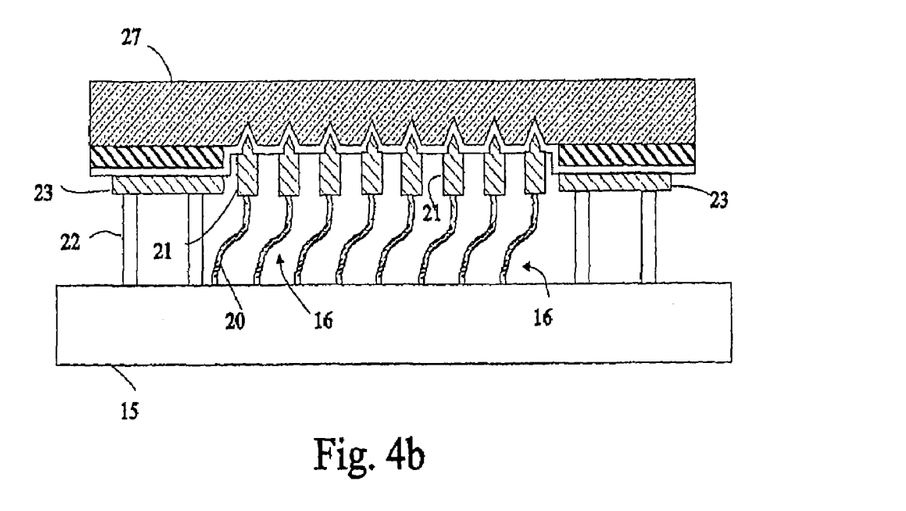
Figure 4C:
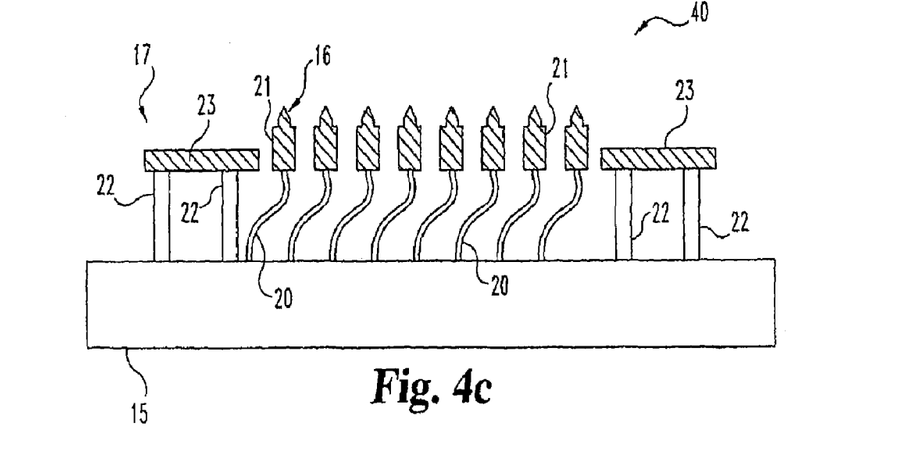

Referring to FIG. 4c, the assembly 36 of probe tips 21 and stop plates 23 of FIG. 3f are shown having been connected to space transformer 15. More specifically, interconnecting wire elements 20 connect probe tips 21 to space transformer 15 to form the plurality of probes 16, and stop plates 23 are connected to and a fixed distance from space transformer 15 by posts 22 to form over travel stop assemblies 17. In one embodiment, such wire elements are formed and connected to space transformer 15 using the wire bond technique wherein each wire is made of a relatively soft, malleable material and is bonded in a known manner, at the desired location, to space transformer 15 (FIG. 4a). Posts 22 may be formed in like manner, but may be thicker to be rigid and/or made of a material that is more rigid. The wire may then be overcoated with a harder, resilient material. Exemplary descriptions of this technique are provided in U.S. Pat. Nos. 5,476,211, 5,917,707, and 6,336,269, which are hereby incorporated by reference.

Alternatively, elements 20 need not be wires. For example, elements 20 may be resilient spring-like structures formed lithographically by applying and patterning a masking layer to space transformer 15 and then depositing material in the openings in the masking layer or layers as generally illustrated in FIGS. 3b and 3e above. Indeed, elements 20 may be fashioned in a variety of shapes by molding the masking layer(s) to have the negative of the desired shape (an example of this technique is as described in U.S. Patent Application Publication 2002/0055282 A1, which is incorporated in its entirety herein by reference) or by using multiple masking layers with different patterned openings to define the negative of the desired shape of elements 20 (an examples of this technique are described in U.S. patent application Ser. No. 09/032,473 (filed Feb. 26, 1998) and U.S. Pat. No. 6,268,015, both of which are also incorporated in their entirety herein by reference). Alternatively, such lithographic techniques may be used to build elements 20 over the tips 21 and posts 22 over stop plates 23 following the step illustrated in FIG. 3e. All of the foregoing techniques may also be used to make posts 22.

As should be apparent from the foregoing, the invention is not limited to any particular type of probe. Rather, the present invention contemplates use of any appropriate probe including, without limitation, needle probes, buckling beam probes (e.g., "COBRA" probes), bumps, posts, and spring probes, examples of which are discussed above. Moreover, the probes may be made and assembled into an array in any manner. For example, probes may be made lithographically, by machining, by stamping, by molding, by microelectrical mechanical system (MEMS) processes, etc. and then assembled into an array. An example in which probes are made using a MEMS process and then assembled into an array is discussed in U.S. patent application Ser. No. 10/262,712 (filed Jul. 24, 2002), which is incorporated in its entirety herein by reference.

The stop structures may also be made and assembled in of the foregoing ways. Typically, posts 22 are made with sufficient rigidity that, upon engagement of over travel stop assemblies 17 with DUT 11, posts 22 will not significantly deform and will physically stop further travel of DUT 11 toward probe card assembly 10.

Referring again to the example illustrated in FIGS. 3a-4b, as shown in FIG. 4b, the assembly 38 (FIG. 4a) of wire elements 20 and posts 22 extending from space transformer 15 is then brought together with the assembly 36 (FIG. 3f) of probe tips 21 and stop plates 23 formed upon on sacrificial substrate 27. As shown, probe tips 21 and stop plates 23 are all sized and located on sacrificial substrate 27, and wire elements 20 and posts 22 are all sized and located on space transformer 15, so that each probe tip 21 aligns with a corresponding wire element 20 and each stop plate 23 aligns with a corresponding pair of posts 22. Probe tips 21 are then permanently bonded to wire elements 20, and stop plates 23 are permanently bonded to posts 22. Such bonding may be performed in any appropriate manner such as, and without limitation, soldering or brazing. Such connection methods are described with reference to FIGS. 8D and 8E in the U.S. Pat. No. 5,974,662 patent.

Following connection of the probe tips 21 and stop plates 23 to wire elements 20 and posts 22, respectively, sacrificial substrate 27 is removed by any appropriate method such as, but without limitation, etching or dissolving. The resulting space transformer assembly 40 may be joined with other components to form a probe card assembly 10, such as the probe card assembly shown in FIG. 5 of the U.S. Pat. No. 5,974,662 patent.

In use, when DUT 11 and probe card assembly 10 are brought together and probe tips 21 engage with corresponding bond pads 19, the resilient, spring-like wire elements compress or deform (as shown in FIG. 2). To ensure that DUT 11 moves close enough to probe card assembly 10 to allow all of probes 16 to deform and achieve a sufficiently resistive spring force and thus reliable pressure contact with their corresponding bond pads 19, neighboring over travel stop assemblies 17 engage DUT 11 at a predetermined distance of travel to physically preclude additional over travel. With probe card assembly 10 constructed as described and shown in FIG. 1, the combined depth of pits 26 and the thickness of mask 31 corresponds to the over travel distance 41 (FIG. 1) permitted by the present invention.

Figure 5:
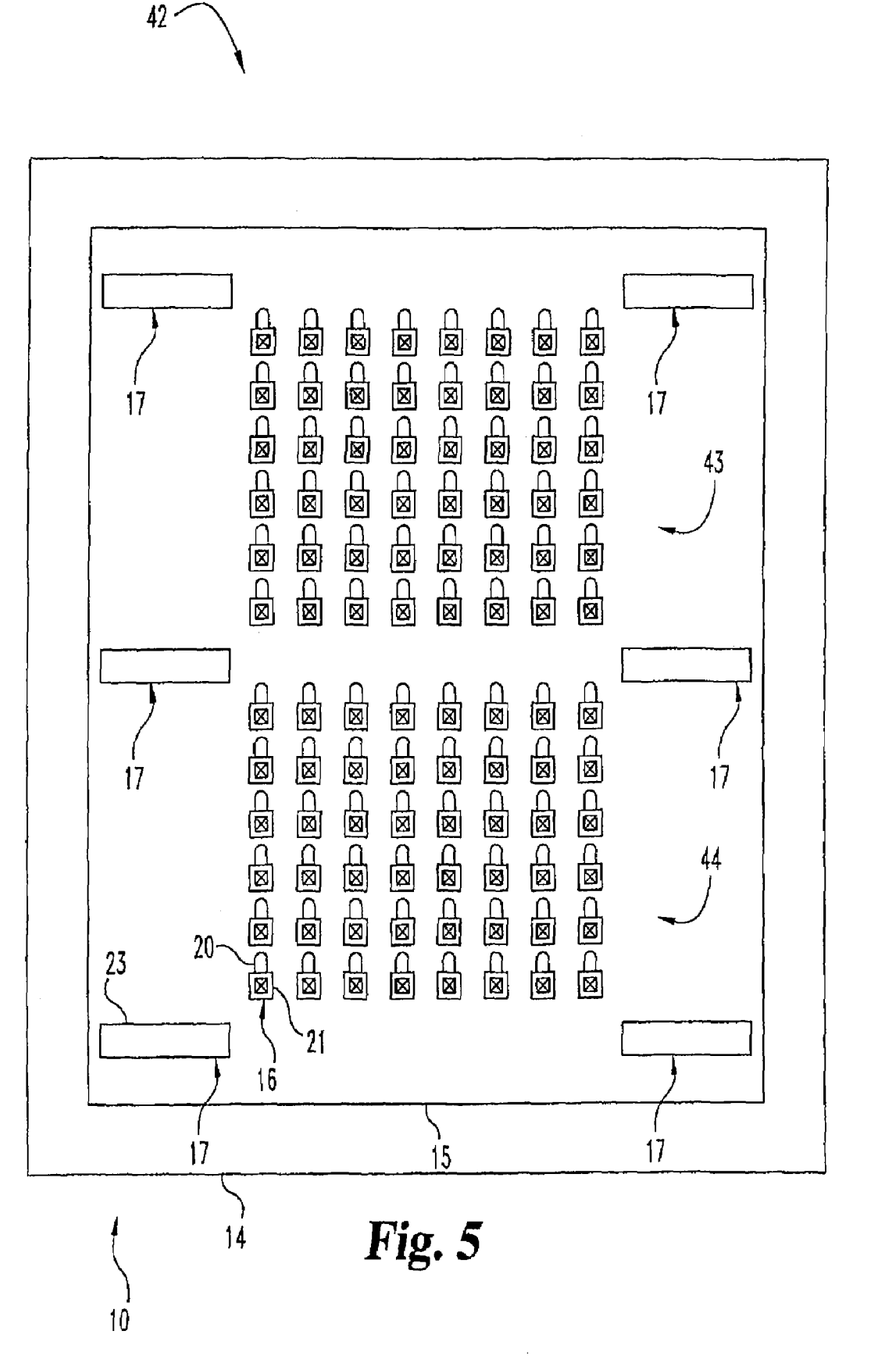
FIG. 5 is a bottom view of the probe card assembly 10 of FIG. 1.

The probe card assembly 10 of FIG. 1 shows just eight probes 16 and a pair of neighboring stop assemblies 17. Another configuration is shown in FIG. 5 where the probe card assembly 42 (bottom view) has two arrays 43 and 44, each containing 48 probes 16 extending downwardly from space transformer 15, and where there are six over travel stop assemblies 17 spaced around the outside of the two arrays 43 and 44. It is contemplated that probe card assembly 42 or a similar probe card assembly may be used to test DUT's with fewer bond pads 19 than are contained in the corresponding array(s) of probes 16. Such excess probes 16 that do not contact a corresponding bond pad (or an inactive bond pad) can be deselected by software.

The test system in which the probe card assembly of the present invention is incorporated may operate to move DUT 11 toward a stationary probe card assembly 10 or to move probe card assembly 10 toward a stationary DUT 11 or to move both DUT 11 and probe card assembly 10 towards each other. Further, such test system may be configured for such movement by the DUT 11 and/or probe card assembly 10 to be effected manually or automatically. It is contemplated that such test system will incorporate any appropriate configuration of machinery, computer hardware and software to effect such manual or automatic movement, to provide for adjustment of the limits, path and rate of such movement, and to receive, process and display output data produced during such movement and from the engagement between the DUT and the probe card assembly.

Figure 6:
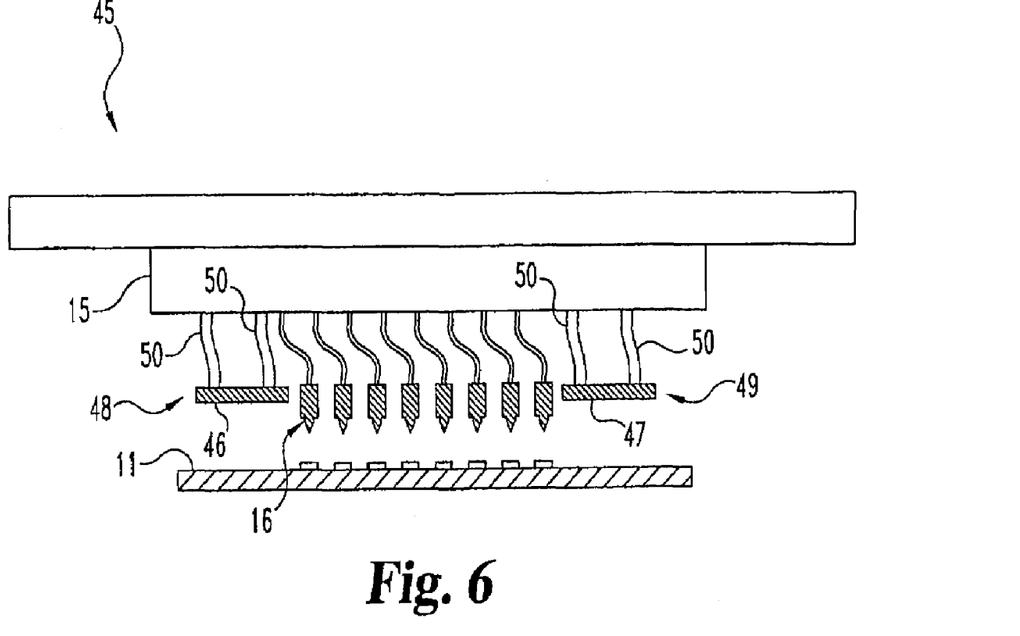
FIG. 6 is a side, partially cross-sectional view of a probe card assembly 45 positioned to engage with a semiconductor device 11 ("DUT") in accordance with an alternative embodiment of the present invention.

Alternative embodiments are contemplated wherein there are more or less than two posts 22 connecting and holding each stop plate 23. Alternative embodiments are contemplated wherein plates 23 are in shapes other than the relatively planar and rectangular configuration shown. Alternative embodiments are contemplated wherein posts 22 are not rigid, but instead are somewhat resilient to provide a degree of "give" or "compliance" when DUT 11 engages with over travel stop assemblies 17. For example, as shown in FIG. 6, a probe card assembly 45 is shown in accordance with another embodiment of the present invention wherein the stop plates 46 and 47 of over travel stop assemblies 48 and 49 are held by resilient posts 50. (Like probe card assembly 10 of FIG. 1, the probe card assembly 45 shows just eight probes 16 and just two over travel stop assemblies 48 and 49. The invention contemplates any number of probes and stop assemblies to properly engage with the bond pads of a DUT 11 to be tested). Posts 50 may be formed and connected to space transformer 15 using any appropriate method, including those techniques discussed herein for forming and connecting wire elements 20.

Figure 7:
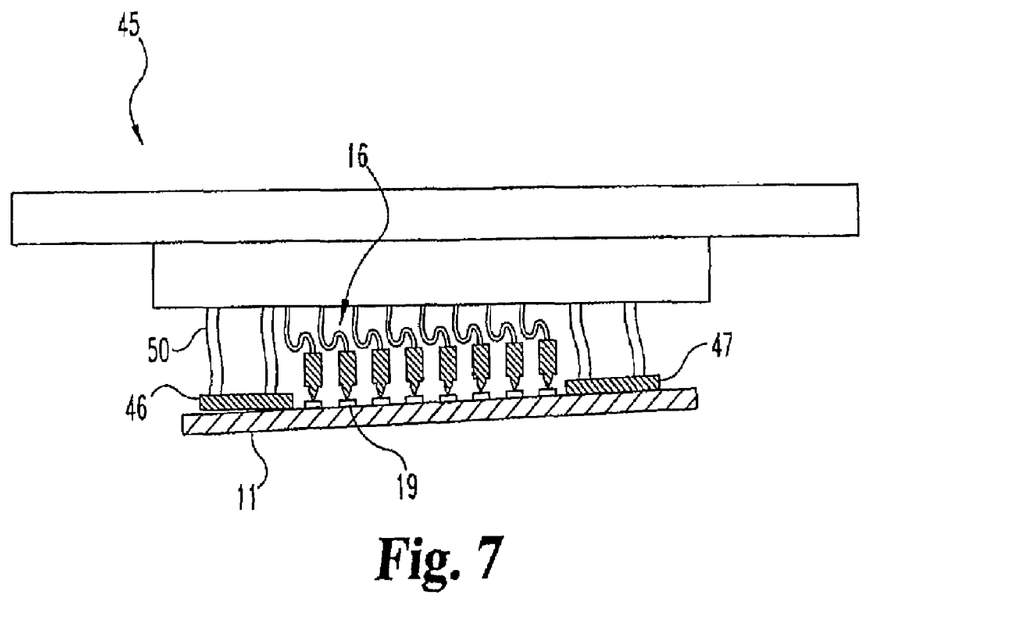
FIG. 7 is a side, partially cross-sectional view of the probe card assembly 45 of FIG. 6 shown in engagement with DUT 11.

One benefit of making posts 50 resilient is realized in the event that DUT 11 is at all non-planar, that any of stop plates 46 and 47 are or have become non-planar, that stop plates 46 and 47 of over travel stop assemblies 48 and 49 are or have become mutually non-planar, and/or that DUT 11 is not parallel to the plane of the stop plates 46 and 47 at the moment of engagement therewith. Thus, referring to FIG. 7 where, in exaggerated fashion, DUT 11 is shown to be non-planar at the moment of initial engagement, the resiliency of posts 50 allows the first stop plate 46 to engage, and its resilient posts will deform until the other stop plate 47 likewise engages. The resiliency of posts 50 is selected to permit such deformation by one or a few of the posts when necessary, but to also still provide a physical over travel limit when all the over travel stop assemblies 48 are engaged. Alternative embodiments are contemplated where posts 50 are made to be both rigid and resilient. That is, a portion of each post 50 is made resilient to enable a limited degree of give (as shown in FIG. 7) and another portion of each post is made rigid to define the maximum limit of give, and thus overtravel. Alternative embodiments are also contemplated wherein plates 23 are not rigid, but instead are somewhat resilient to provide a degree of "give" or "compliance" when DUT 11 engages with over travel stop assemblies 17.

Alternative embodiments are contemplated wherein one or more over travel stop assemblies are wired to provide a signal that the corresponding DUT 11 has been engaged. Such signal may simply indicate engagement or may signal the extent of engagement (e.g., by signaling a degree of force exerted by the wafer on the probes or the over travel stop). For example, such signal may provide a binary output x: no contact (x=0), contact (x=1). Alternatively, a more detailed response may be provided by the output value x: no contact (x=0), contact (0<x≦1) where any x greater than 0 indicates contact and the value of x greater than 0 and less than or equal to 1 indicates the extent of travel of the DUT from initial contact up to and including the limit of travel. Such output signal is contemplated to be received as input by computer components connected with the probe card assembly and displayed in any appropriate form and/or used to further control the overall probe testing operation. Typically, such output signal would be sent to the tester or prober, which would then stop movement of the probe card assembly toward the semiconductor wafer when the desired over travel limit is reached.

Figures 8, 9:
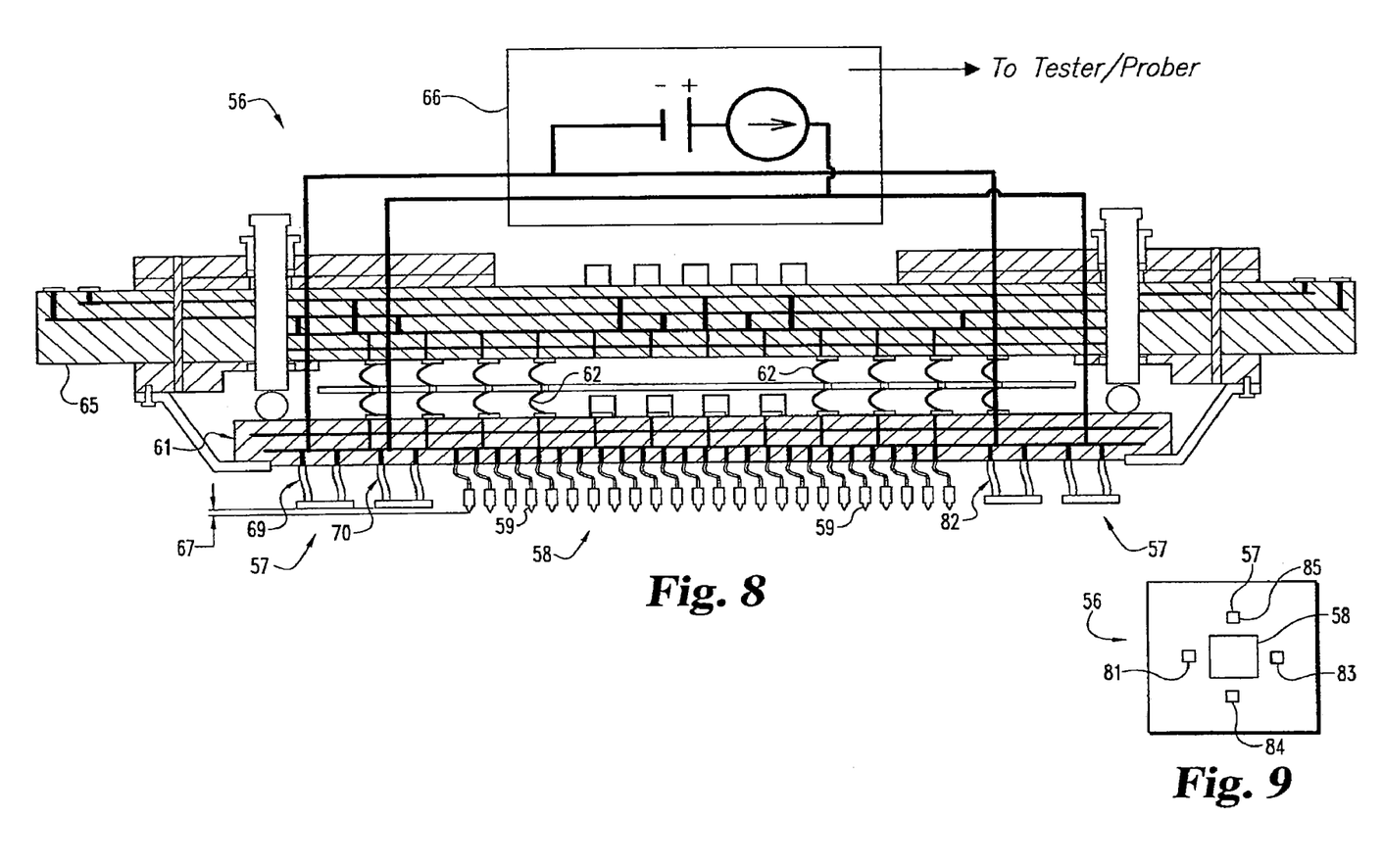
FIG. 8 is a side, cross-sectional and partially diagrammatic view of a probe card assembly 56 in accordance with another embodiment of the present invention.
FIG. 9 is a plan, diagrammatic view of the probe card assembly 56 of FIG. 8.

An example of such assembly in shown in FIG. 8, where a probe card assembly 56 includes over travel stop assemblies 57 that are wired to provide over travel position output signals. Like probe card assembly 45 of FIG. 6 and similar to the probe card assembly 500 of FIG. 5 of the U.S. Pat. No. 5,974,662 patent, probe card assembly 56 includes an array 58 of probes 59 and over travel stop assemblies 57 mounted to a spaced transformer 61, which is electronically connected by various interconnection wire elements 62 and an interposer 63 to a probe card assembly 65. An over travel control unit 66 is wired to the over travel stop assemblies 57 whereby the over travel output signals are transmitted to control unit 66, which transmits corresponding signals to the tester/prober (not shown). The allowable over travel is indicated at 67. FIG. 9 is a plan view of the probe card assembly 56 showing diagrammatically one exemplary placement of over travel stop assemblies 57 relative to the array 58 of probes 59.

Figure 10:
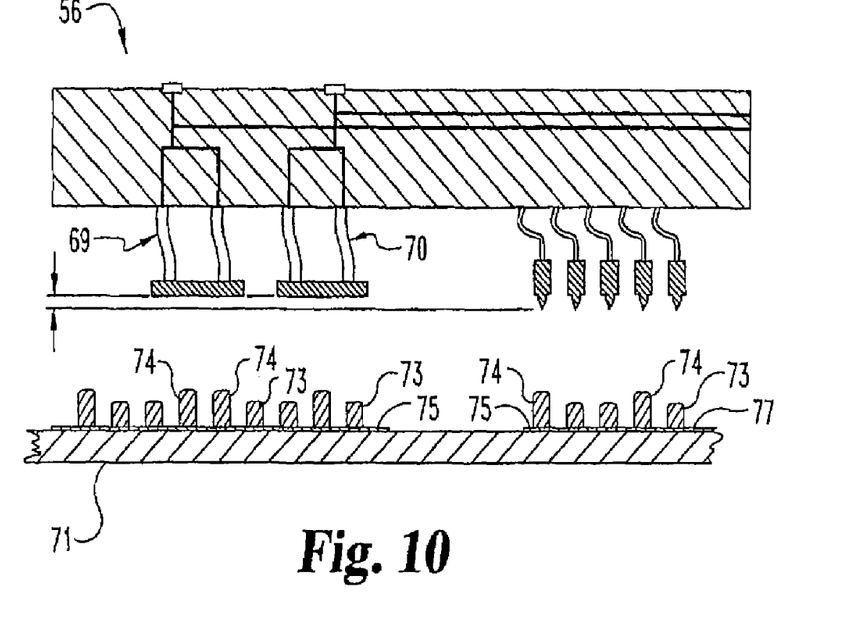
FIG. 10 is a side, cross-sectional view of a portion of probe card assembly 56 of FIG. 8 and positioned to engage with a wafer 71.
Figure 11:
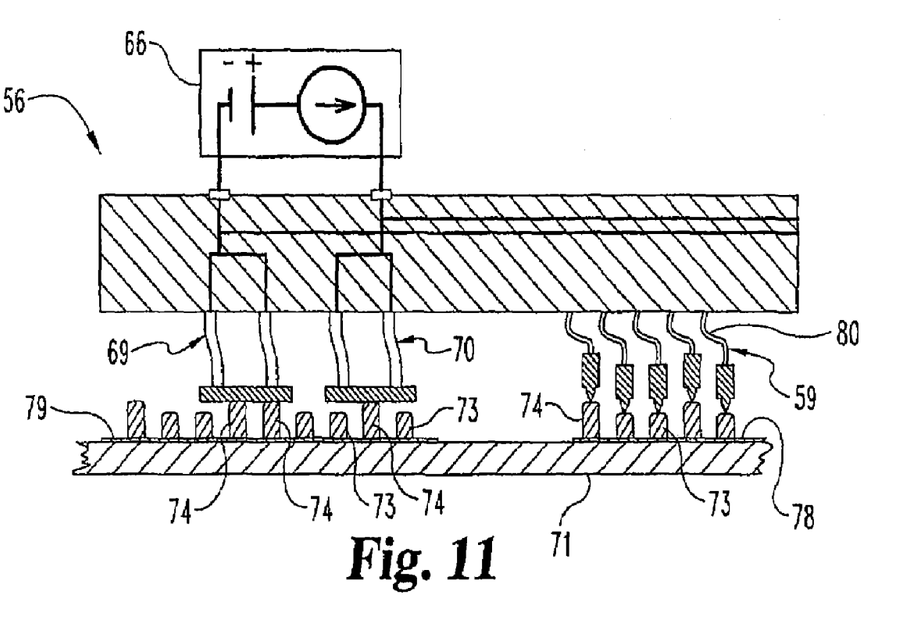
FIG. 11 is a side, cross-sectional view of the probe card assembly 56 of FIG. 10 and shown in engagement with wafer 71.

FIGS. 10 and 11 illustrate one exemplary arrangement for detecting completion of a desired amount of over travel of bond pads or pins 73, 74 of wafer 71 with respect to probes 59. Referring to FIG. 10, the over travel stop assemblies 57 are arranged in adjacent pairs. Thus, at each of the four sites of the probe card assembly 56 of this embodiment (FIG. 9), probe card assembly 56 includes a pair of over travel stop assemblies 69 and 70. In each die on the wafer 71 to be tested, the bond pads or pins 73, 74 comprise functioning pins 73 and dummy pins 74. (Pins 73, 74 in FIGS. 10 and 11 are shown as having slightly different heights due to inherent manufacturing imprecision.) Functioning pins 73 are functional in providing the desired power, ground and signal capabilities for their corresponding die 76 (or 77), while dummy pins 72 are shorted to ground.

In use, when wafer 71 and probe card assembly 56 are brought together, probe tips 59 will engage with corresponding pins on the DUT 11 (device under test) 78. Because of the resiliency of the wire element 80 of each probe 59, each probe 59 will deform as necessary and engage with each of its corresponding pins 73 and 74. It should be noted that there may or may not be a probe 59 that corresponds to a particular dummy pin 74. It should also be noted that the contact plates of over travel assemblies 69 and 70 are preferably made to correspond to known locations of dummy pins 74 on wafer 71. A circuit will be completed and a corresponding signal will be generated and transmitted through control unit 66 to the prober/tester (not shown), and movement of probe card assembly 56 toward wafer 71 will stop. The invention contemplates that the system software will be configured to control the testing operation in response to any desired contact combination. That is, in one embodiment, contact by any two adjacent over travel stop assemblies (i.e. 69 and 70) with dummy pins will cause movement of probe card assembly 56 to stop. Alternatively, referring to FIGS. 8 and 9, any one over travel stop assembly (i.e. 69) at one side 81 of array 58 and any one over travel stop assembly (i.e. 82) at another side 83 (or 84 or 85), can be programmed to stop movement of probe card assembly 56. Alternatively, just one over travel stop assembly (i.e. 69) could be programmed to stop movement of probe card assembly 56.

Alternative embodiments are contemplated wherein two or more over travel stop assemblies are wired as above and the output thus indicates which over travel stop assemblies have engaged with the DUT 11 and by how much. Such output, from just one or from a plurality of the over travel stop assemblies, is contemplated to be made available for display or other recognition by a human or machine. Thus, such output may simply be indicated by a single LED flashing or by a buzzer. Alternatively or in addition, a display screen may diagrammatically indicate the entire probe card assembly layout and show by any appropriate display which over travel stop assemblies have been engaged and by how much. Alternatively or in addition, the output signal may be received by a computer or other machine and acted upon. For example, a signal that an over travel stop assembly has engaged a bond pad or pin may cause the system to cease movement of the probe card assembly toward the DUT 11, or visa versa, or movement for only another pre-programmed distance. Where the output signal indicates the extent of engagement, such information can be used by the human user or the machine to adjust the limits of movement of the DUT relative to the probe card assembly, as well as the rate of such movement.

Figure 12:
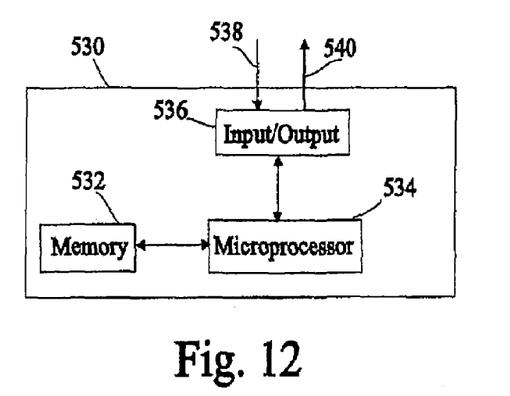
FIG. 12 illustrates an exemplary microprocessor based controller.
Figure 13:
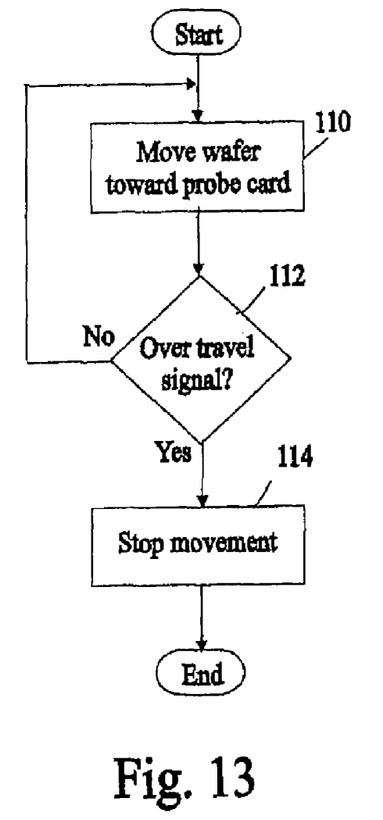
FIGS. 13 and 14 illustrate exemplary processes for controlling movement of a wafer into contact with a probe assembly.
Figure 14:
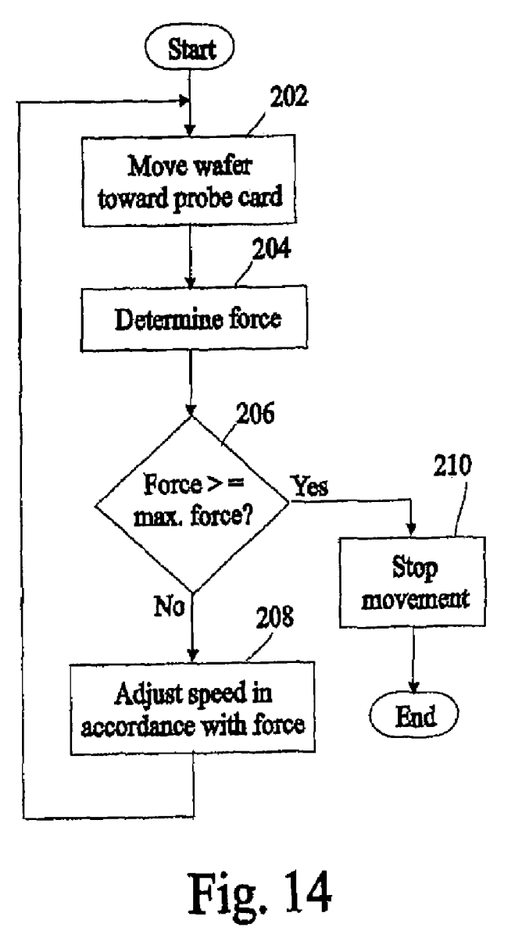

FIGS. 13 and 14 illustrate exemplary methods for automatically controlling movement of a wafer to be tested into contact with a probe card assembly, and FIG. 12 illustrates a feedback controller 530 that may implement any of the processes of FIGS. 13 and 14. The exemplary feedback controller 530 illustrated in FIG. 12 is a microprocessor based controller and may be, for example, part of control apparatus 13. As shown, it includes a digital memory 532, a microprocessor 534, and an input/output port 536. Input data 538 is received and output data 540 is output through input/output port 536. The digital memory 532 may be any type of memory including an electronic memory, an optical memory, a magnetic memory, or some combination of the foregoing. As just two examples, digital memory 532 may be a read only memory, or digital memory 532 may be a combination of a magnetic or optical disk and a random access memory. Microprocessor 534 executes instructions (which may be in the form of software or microcode) stored in digital memory 532.

The exemplary methods illustrated in FIGS. 13 and 14, which may be implemented in software and executed on a microprocessor based system such as the one illustrated in FIG. 12, will be explained with reference to a probe card assembly 56 such as the one illustrated in FIGS. 8-11 in a tester 5 like the one illustrated in FIG. 1. For purposes of discussion only, it is assumed that a wafer such as exemplary wafer 71 is moved while probe card assembly 56 is held stationary. Of course, the wafer could alternatively be held stationary and probe card assembly moved, or both the wafer and the probe card assembly could be moved. The wafer 71 may be supported by any appropriate means, such as the wafer holder 18 illustrated in FIG. 1, which itself is moved by any appropriate means, such as an electric motor (not shown). Output data 540 (FIG. 12) includes signals that control movement of the wafer 71 (e.g., by moving the wafer holder 18), and input data 538 includes signals from over travel control unit 66 or other sensors (e.g., the output of over travel control unit 66 may be directed to feedback controller 530 as input data 538).

The exemplary method illustrated in FIG. 13 utilizes one or more sensors for detecting when the wafer 71 has been moved into contact with the probes 71 and then further moved by a desired amount of over travel past first contact. For illustration purposes, the sensor(s) is assumed to comprise over travel stop assemblies 69, 70 wired to detect contact as illustrated in FIGS. 10 and 11. It should be understood, however, that any sensor for detecting or estimating when the wafer 71 has been moved the desired over travel distance may be used. Such sensors include by way of example acoustic sensors, optical sensors, etc., which may be used to detect, for example, when the over travel stops reach a particular position. It should also be noted that one to several such sensors may be used, and if a plurality of sensors are used, the sensors may be arranged in any pattern on probe card assembly 56. The pattern of four sensors 81, 83, 84, 85 illustrated in FIG. 9 is but one exemplary pattern.

Turning now to the exemplary method illustrated in FIG. 13, this exemplary method begins after wafer (e.g., wafer 71 shown in FIGS. 10 and 11) has been placed on a moveable holder (e.g., wafer holder 18 illustrated in FIG. 1), and pads or pins 73, 74 of wafer have been aligned with probes 59, as illustrated in FIG. 10. As shown in FIG. 13, the first step 110 is to move the wafer 71 toward the probe card assembly 56. At step 112, it is determined whether the pins 73, 74 on wafer 71 have been moved into contact with probes 59 and over traveled the desired distance. If no, movement of the wafer 71 toward the probe card assembly 56 continues (step 110). If yes, movement of the wafer 71 is stopped at step 114.

Determining whether pins 73, 74 have reached the desired over-travel (step 112) may be detected or estimated in any way. As just one example, stop structures 69, 70, such as those illustrated in FIGS. 10 and 11 may be configured so that an over travel sensor 66 generates a signal when over travel stops 69, 70 contact pins 73, 74. That signal may be input to controller 530 as input signal 538. As mentioned above, other types of sensors may be used. Also, any number of sensors may be used, and if multiple sensors are used, they may be positioned in any suitable pattern. If multiple sensors are used, a signal indicating that the desired amount of over travel has been reached may be triggered by any one or more of the sensors in any desired pairing or sequence. For example, referring to the exemplary pattern of sensors 81, 83, 84, 85 shown in FIG. 9, a over-travel-reached state may be found to be affirmative at step 112 when any one of the sensors 81, 83, 84, 85 is activated. As another nonexclusive example, the over-travel-reached state may be found to be affirmative at step 112 only after all four sensors 81, 83, 84, 85 are activated. As another example, the over-travel-reached state may be found at step 112 after a pair of sensors (e.g., opposite pairs 81, 83, or pairs 84, 85) are activated. Many other combinations are possible.

Turning now to the exemplary method illustrated in FIG. 14, this exemplary method also begins after a wafer (e.g., wafer 71 shown in FIGS. 10 and 11) has been placed on a moveable holder (e.g., wafer holder 18 illustrated in FIG. 1), and pads or pins 73, 74 of wafer 71 have been aligned with probes 59, as illustrated in FIG. 10. As shown in FIG. 14, the first step 202 is to move the wafer 71 toward the probe card assembly 56 at an initial speed. During this movement, the force the wafer pads or pins 73, 74 exert against probes 59 is determined at step 204, and it is determined at step 206 whether the force exceeds a predetermined maximum force. (Of course, before first contact between the pads or pins 73, 74 and probes 59, the force is zero.) If yes, movement of the wafer 71 toward the probe card assembly 56 is stopped at step 210 (e.g., controller 530 issues control signals 540 that cause movement to stop). If, however, the determined force is less than the maximum force (step 206), at step 206, the speed of the movement of the wafer 71 toward the probe card assembly 56 is adjusted in accordance with the force determined at step 204 (e.g., again the controller 530 issues control signal(s) 540 that adjusts the speed). Preferably, the speed is decreased as the force increases. The steps of moving the wafer 71 toward the probe card assembly 56 (step 202), determining the force 204, and adjusting the speed of the wafer 71 (step 208) are repeated until the force on the probes 56 exceeds the maximum force (step 206). It should be noted that step 208 is optional. That is, the process of FIG. 15 can be performed without adjusting the speed following a negative determination at step 206.

Again, there are many different types of sensors that may be used to determine or estimate the force on a probe. For example, over travel stops 69, 70 may be fitted with force measuring sensors (e.g., a piezoelectric material). Alternatively, force measuring device(s) may be connected directly to one or more probes 59. Also, one or more such sensors may be used. If more than one is used, the step of determining the force 204 may comprise averaging the forces detected by all of the sensors.

Figure 15A:
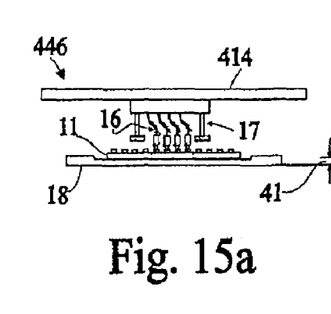
FIGS. 15a-15c illustrate a probe card assembly with a flexible base.
Figure 15B:
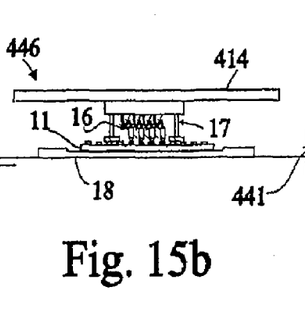
Figure 15C:
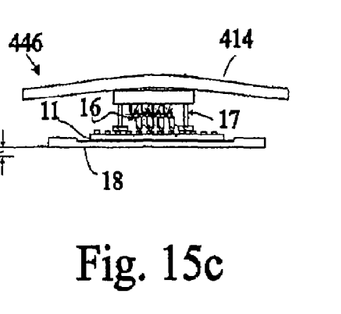

FIGS. 15a-15c illustrate a probe card assembly 446 in which base 414 is made of a flexible material. As will be seen, because the base 414 is flexible, it absorbs extra over travel, As shown in FIG. 15a, wafer holder 18 brings wafer 11 into first contact with probes 16. As shown in FIG. 15b, wafer holder 18 moves wafer 11 past the point of first contact by an over travel distance 41. As shown in FIG. 15c, for whatever reason, wafer holder 18 moves wafer 11 beyond the desired over travel 41 by an additional over travel distance 441. Normally, the additional over travel 441 could cause excessive forces to be exerted on the over travel assemblies 17 and possibly the probes 16. As also shown in FIG. 16c, however, the base flexes, absorbing all or at least part of the additional over travel 441, eliminating or at least reducing the excessive forces caused by the additional over travel 441. The base 414 may be made of any material that is sufficiently rigid to support probes 16 but sufficiently flexible to absorb all or part of over travel 441. Examples of such materials include, without limitation, printed circuit board material, Mylar, organic materials, rubbers, and plastics.

While the invention has been illustrated and described in detail in the drawings and foregoing description, the same is to be considered as illustrated and not restrictive in character, it being understood that only the preferred embodiment has been shown and described and that all changes and modifications that come within the spirit of the invention are desired to be protected.

What is claimed is:

1. A method of making a probe card assembly, said method comprising:
   forming a plurality of probes on a surface of a substrate; and
   forming a stop structure on said surface of said substrate, wherein said forming a plurality of probes and said forming a stop structure comprise:
   lithographically forming a plurality of tip structures and a stop plate on a sacrificial substrate; and
   transferring said tip structures to a plurality of probe bodies attached to said surface of said substrate; and
   transferring said stop plate to a stop support attached to said surface of said substrate.

2. The method of claim 1, wherein:
   said transferring said tip structures to a plurality of probe bodies attached to said surface of said substrate, and said transferring said stop plate to a stop support attached to said surface of said substrate comprise:
   attaching said tip structures to said probe bodies;
   attaching said stop plate to said stop support; and
   releasing said tip structures and said stop plate from said sacrificial substrate.

3. The method of claim 1, wherein said lithographically forming a plurality of tip structures and a stop plate on a sacrificial substrate comprises:
   patterning a plurality of masking layers; and
   depositing material within said patterned masking layers to form said tip structures and said stop plate.

4. The method of claim 3, wherein said patterned masking layers define shapes of said tip structures and said stop plate.

5. The method of claim 3, wherein said patterned masking layers define relative locations of said tip structures and said stop plate.

6. The method of claim 5, wherein contact portions of said tip structures are located in a first plane and a contact portion of said stop plate is located in a second plane, and said first plane is a predetermined distance from said second plane.

* * * * *